(12) United States Patent  (10) Patent No.: US 6,582,889 B1
Kamijima                   (45) Date of Patent:  Jun. 24, 2003

(54) METHOD FOR FORMING RESIST PATTERN AND MANUFACTURING METHOD OF THIN-FILM ELEMENT

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 84 days.

(21) Appl. No.: 09/613,595

(22) Filed: Jul. 10, 2000

(30) Foreign Application Priority Data

Aug. 26, 1999 (JP) .......................................... 11-240001

(51) Int. Cl.$^7$ .............................. G03F 7/00; G03F 7/40; B44C 1/22
(52) U.S. Cl. ..................... 430/312; 430/313; 430/314; 430/317; 427/58; 427/282; 216/12; 216/41; 216/47
(58) Field of Search ................................ 430/311, 313, 430/314, 317; 427/58, 282; 216/12, 41, 47

(56) References Cited

U.S. PATENT DOCUMENTS

| 4,814,258 A | * | 3/1989 | Tam ............................ 430/315 |
| 4,906,552 A | * | 3/1990 | Ngo ............................ 430/312 |
| 4,981,809 A | * | 1/1991 | Mitsuaki ....................... 437/41 |
| 5,077,174 A | * | 12/1991 | Bauer et al. .................. 430/326 |
| 5,360,698 A | * | 11/1994 | Hanrahan ..................... 430/326 |
| 5,532,109 A | * | 7/1996 | Krounbi ....................... 430/271 |
| 5,658,469 A | * | 8/1997 | Jennison ...................... 428/611 |
| 5,725,997 A | * | 3/1998 | Kamijima ..................... 430/325 |
| 5,747,198 A |   | 5/1998 | Kamijima ..................... 430/11 |
| 5,985,162 A | * | 11/1999 | Han et al. ..................... 216/22 |

FOREIGN PATENT DOCUMENTS

| JP | 58-2029     | 1/1983  |
| JP | 59-48927    | 3/1984  |
| JP | 62-47045    | 2/1987  |
| JP | 62-232124   | 10/1987 |
| JP | 9-92605     | 4/1997  |
| JP | 9-260270    | 10/1997 |
| JP | 10-261208   | 9/1998  |
| JP | 10-312063   | 11/1998 |

* cited by examiner

Primary Examiner—Mark F. Huff
Assistant Examiner—Kripa Sagar
(74) Attorney, Agent, or Firm—Armstrong, Westerman & Hattori, LLP

(57) ABSTRACT

A two layer structure resist pattern with a T-shaped cross section, consisting of a lower layer and an upper layer with overhang portions is formed, and then the formed two layer structure resist pattern is heat-treated so that the overhang portions of the upper layer incline downward.

27 Claims, 10 Drawing Sheets

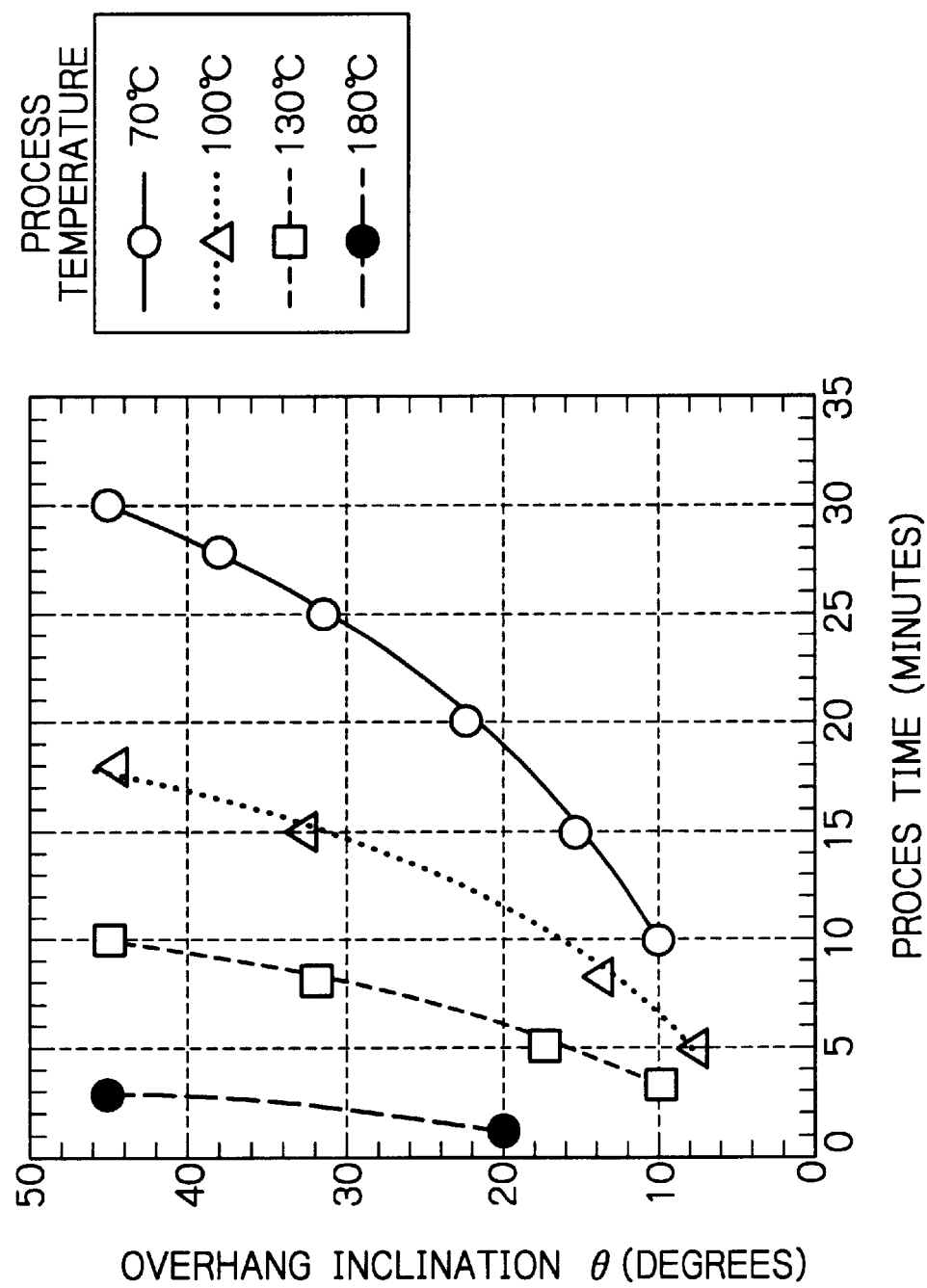

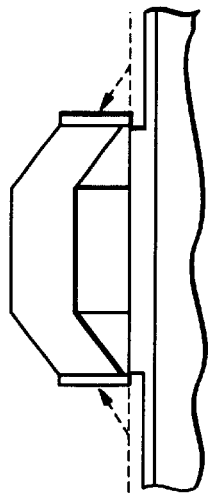
Fig. 5a
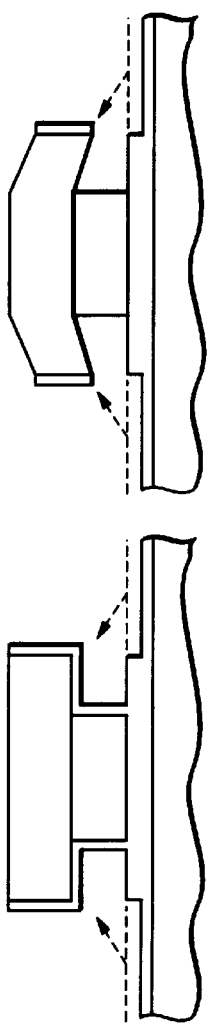
Fig. 5b
Fig. 5c
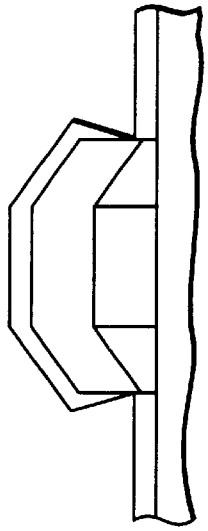
Fig. 5d
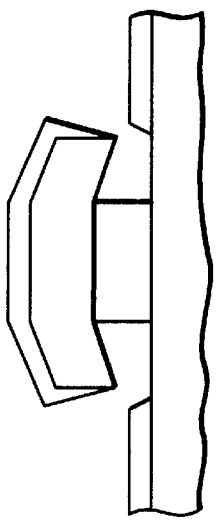
Fig. 5e
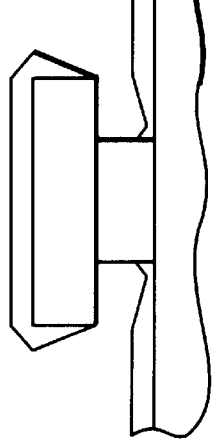
Fig. 5f

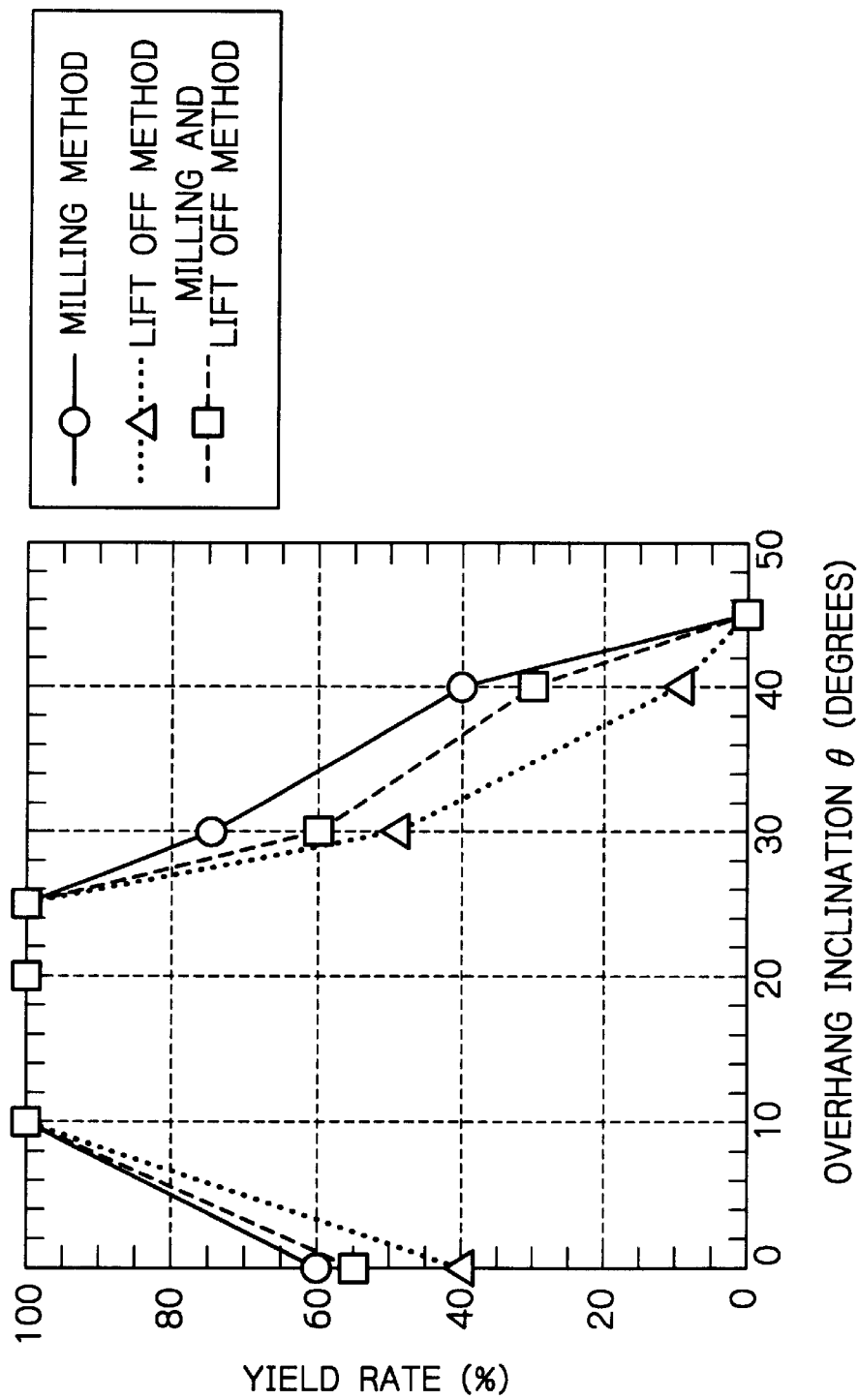

Fig. 10a
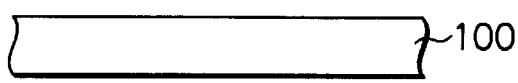
Fig. 10b
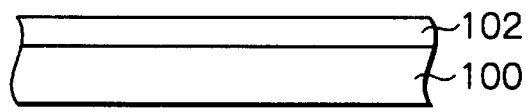
Fig. 10c
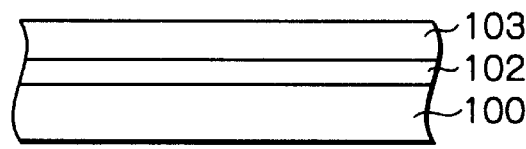
Fig. 10d
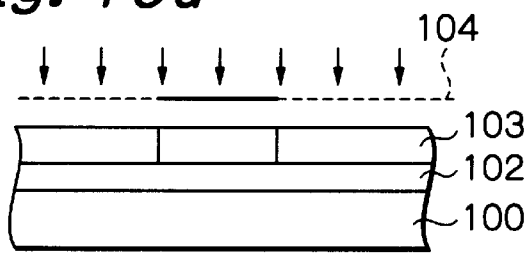
Fig. 10e
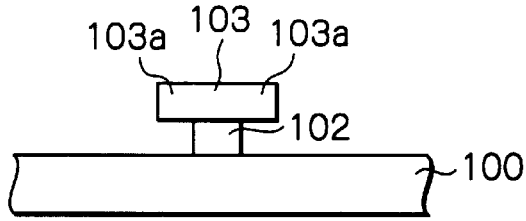
Fig. 10f
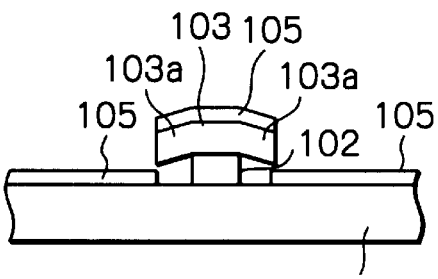
Fig. 10g
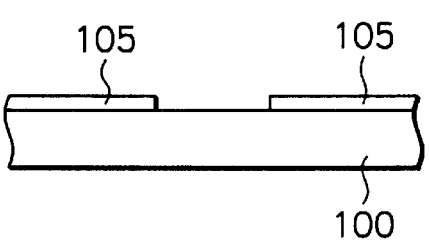
Fig. 10h

METHOD FOR FORMING RESIST PATTERN AND MANUFACTURING METHOD OF THIN-FILM ELEMENT

FIELD OF THE INVENTION

The present invention relates to a method for forming a resist pattern and a manufacturing method of a thin-film element wherein resist patterns for patterning thin-films are formed by using the above-mentioned forming method.

DESCRIPTION OF THE RELATED ART

Fabrication of a thin-film element such as a thin-film magnetic head includes several thin-film patterning processes such as milling or dry-etching processes or lift off processes. Each of the patterning processes starts from a process of forming a photoresist pattern.

There are various structures for the photoresist pattern. Recently, a photoresist pattern with two-layer structure having reverse-trapezoid cross section or T-shaped cross section has received attention.

FIG. 1 illustrates a conventional photoresist pattern with the two-layer structure having T-shaped cross-section.

As shown in the figure, this photoresist structure has a two-layer photoresist structure formed by multi-layering a polymethyl glutarimide (PMGI) layer 11 and a resist layer 12 on a substrate 10. The resist layer 12 protrudes toward the lateral direction and thus has a larger width than the PMGI layer 11. As will be noted form the figure, the conventional two-layer photoresist structure has the T-shaped cross section in which overhang portions 12a protrude and extend horizontally from the resist layer 12.

However, if the photoresist pattern with the horizontally extending overhang portions 12a is used for the milling process, material removed from the milled layer will be re-deposited on the side surface of the PMGI layer 11 and on the bottom surface of the resist layer 12. These re-deposited materials will finally remain as burrs or micro projections. Furthermore, if the photoresist pattern with the horizontally extending overhang portions 12a is used for the lift off process, material for forming the patterned layer will be deposited on undercut areas positioned below the overhang portions 12a and thus precise and correct pattern cannot be obtained. The above-mentioned tendency becomes remarkable when the milling process or the sputtering process is performed by leaning and rotating the substrate causing the rate of fabricating defectives to increase and the yield in manufacturing thin-film elements to become worse.

Japanese unexamined patent publication No.10-261208 discloses a manufacturing method of a magnetoresistive effect (MR) head for decreasing the rate of fabricating defectives and for improving the yield in manufacturing thin-film elements. This known method uses a two-layer structure pattern with a lower layer and an upper layer for the lift off process. The upper layer has a width larger than that of the lower layer and has the negative mechanical stress, and thus the upper layer bends so that its center portion upwardly projects and its end portions curve toward the substrate.

SUMMARY OF THE INVENTION

It is therefore an object of the present invention to provide a method for forming a resist pattern and a manufacturing method of a thin-film element, whereby the rate of fabricating defectives (rejection rate) can be extremely decreased and the yield in manufacturing the thin-film elements can be remarkably improved by executing a simple process.

According to the present invention, a method for forming a resist pattern includes a step of forming a two layer structure resist pattern with a T-shaped cross section, which consists of a lower layer and an upper layer with overhang portions, and a step of heat-treating the formed two layer structure resist pattern so that the overhang portions of the upper layer incline downward.

Also, according to the present invention, a method for manufacturing a thin-film element includes a step of forming a two layer structure resist pattern with a T-shaped cross section, which consists of a lower layer and an upper layer with overhang portions, a step of heat-treating the formed two layer structure resist pattern so that the overhang portions of the upper layer incline downward, and a step of patterning a thin-film using the heat-treated two layer structure resist pattern.

According to the present invention, further, a method for manufacturing a thin-film element includes a step of depositing a layer to be patterned on a substrate, a step of forming a two layer structure resist pattern with a T-shaped cross section on the layer to be patterned, which consists of a lower layer and an upper layer with overhang portions, a step of heat-treating the formed two layer structure resist pattern so that the overhang portions of the upper layer incline downward, and a step of dry-etching the layer to be patterned, using the heat-treated two layer structure resist pattern.

According to the present invention, still further, a method for manufacturing a thin-film element includes a step of forming a two layer structure resist pattern with a T-shaped cross section on a substrate, which consists of a lower layer and an upper layer with overhang portions, a step of heat-treating the formed two layer structure resist pattern so that the overhang portions of the upper layer incline downward, and a step of depositing a layer to be patterned, using the heat-treated two layer structure resist pattern.

According to the present invention, also, a method for manufacturing a thin-film element includes a step of depositing a first layer to be patterned on a substrate, a step of forming a two layer structure resist pattern with a T-shaped cross section on the first layer to be patterned, which consists of a lower layer and an upper layer with overhang portions, a step of heat-treating the formed two layer structure resist pattern so that the overhang portions of the upper layer incline downward, a step of dry-etching the first layer to be patterned, using the heat-treated two layer structure resist pattern, and a step of depositing a second layer to be patterned, using the heat-treated two layer structure resist pattern.

After a two-layer structure resist pattern with a T-shaped cross section is formed, the two-layer structure resist pattern is heat-treated so that overhang portions of its upper layer incline downward. Thus, when milling patterning is executed, no removed material by milling is re-deposited on the bottom surface of the upper layer of the two layer structure resist pattern and on the side surfaces of the lower layer of the resist pattern. Therefore, no burr will remain on the patterned layer and a precise pattern of satisfactory quality can be provided. When lift off patterning is executed, material of the patterning layer is never deposited on the substrate surface below the overhang portions (undercut regions) of the two-layer structure resist pattern. Thus, a precise pattern of satisfactory quality can be obtained. As a result, the rejection rate is extremely reduced and the yield rate is remarkably improved. Particularly, according to the present invention, since such resist pattern can be obtained only by performing a heat treatment process that is simple and easily controllable, the manufacturing process is never complicated.

It is preferred that the heat-treating step is executed before or during the patterning step, the dry-etching step or the depositing step. In the latter case, it is more preferred that controlling cooling temperature during the patterning step, the dry-etching step or the depositing step performs the heat-treating step. Since no additional process for heat treatment is needed, the resist pattern forming process or the manufacturing process of a thin-film element can be more simplified.

It is also preferred that the lower layer is made of a resin material, and wherein the upper layer is made of a resist material. The resin material may be polymethyl glutarimide (PMGI) or PMGI with dye additives.

It is preferred that the heat-treating step includes heating the formed two layer structure resist pattern so that the overhang portions of the upper layer incline downward by 10 to 25 degrees.

It is also preferred that the heat-treating step includes heating the formed two layer structure resist pattern at a temperature within a range of 70 to 130° C.

Further objects and advantages of the present invention will be apparent from the following description of the preferred embodiments of the invention as illustrated in the accompanying drawings.

BRIEF DESCRIPTION OF THE DRAWINGS

FIG. 4 is a graph illustrating relationship among the process temperature, the process time and the overhang inclination θ;

FIGS. 5a to 5f are sectional views schematically illustrating thin-film patterning processes using variously shaped resist patterns with two-layer structure;

FIG. 6 is graph illustrating relationships between the overhang inclination θ of the overhang portion of the two-layer structure resist pattern and the yield rate of the various patterning methods;

FIGS. 10a to 10h are sectional views schematically illustrating patterning processes of one layer of a thin-film magnetic head element by using a lift off method as a further embodiment of a thin-film element manufacturing method according to the present invention.

DESCRIPTION OF THE PREFERRED EMBODIMENTS

Figure 1:
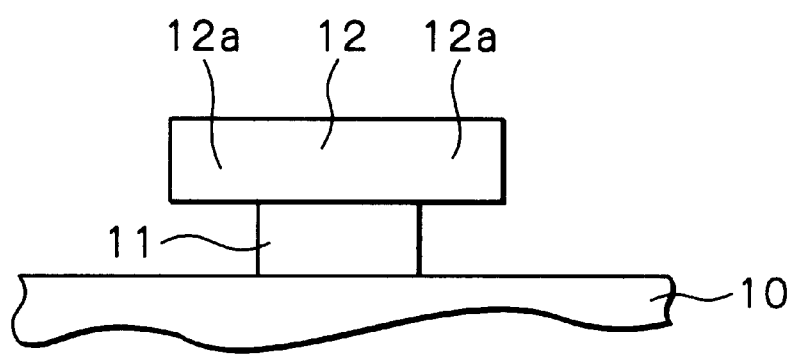
FIG. 1, already described, is a sectional view schematically illustrating already described example of the conventional two-layer structure photoresist with the T-shaped cross section.
Figure 2:
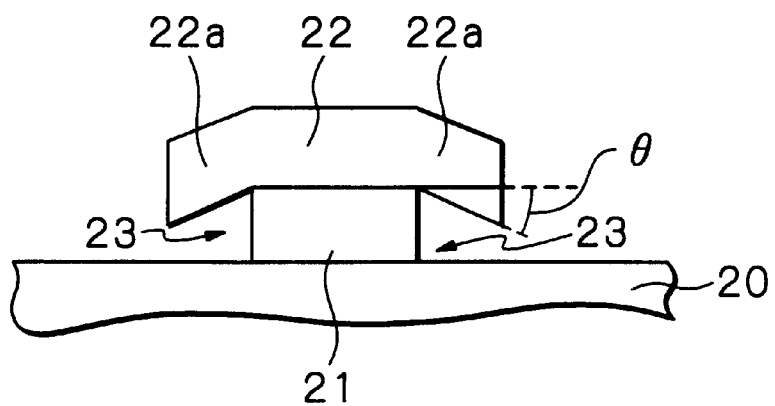
FIG. 2 is a sectional view schematically illustrating a structure of a resist pattern formed by a method according to the present invention.

FIG. 2 schematically illustrates a structure of a resist pattern formed by a method according to the present invention.

In the figure, reference numeral 20 denotes a substrate, 21 a lower layer of a two-layer structure photoresist pattern formed on the substrate 20, and 22 an upper layer of the photoresist pattern. The lower layer 21 is made of resin material such as polymethyl glutarimide (PMGI) or PMGI with dye additives and the upper layer 22 is made of photoresist material.

The upper layer 22 is wider than the lower layer 21. Side parts 22a of the upper layer 22 are projected and inclined downward or toward the substrate 20. In this specification, these projected parts 22a of the upper layer 22 are called as "overhang portions", and spaces 23 below the overhang portions 22a are called as "undercut regions". The angle θ between the inclined overhang portion and the substrate surface is called as "overhang inclination".

Photoresist materials such as novolak type positive resist, chemically amplified positive resist or chemically amplified negative resist is used to make the upper layer 22. PFi-58 of Sumitomo Chemical Co., Ltd., SPR950 of Shipley Co., Ltd., and THMR-iPl800 of Tokyo Ohka Kogyo Co., Ltd. are typical examples of the novolak type positive resist. TDUR-P030 of Tokyo Ohka Kogyo Co., Ltd. and SEPR-402 of Shin-etsu Chemical Co., Ltd. are typical examples of the chemically amplified positive resist. SNR200 of Shipley Co., Ltd. is a typical example of the chemically amplified negative resist.

However, it should be noted that the resin material for the lower layer 21 and the photoresist material for the upper layer 22 are not limited to the above-mentioned examples.

FIGS. 3a to 3i schematically illustrate patterning processes of one layer of a thin-film magnetic head element by using a dry-etching or milling method as a preferred embodiment of a thin-film element manufacturing method according to the present invention.

Figure 3A:
FIGS. 3a to 3i are sectional views schematically illustrating patterning processes of one layer of a thin-film magnetic head element by using a milling method as a preferred embodiment of a thin-film element manufacturing method according to the present invention.
Figure 3G:
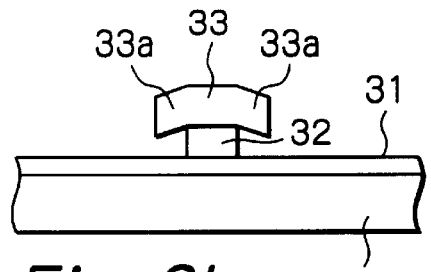
Figure 3B:
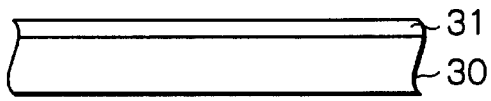

As shown in FIG. 3a, an appropriate substrate 30 made of for example AlTiC is prepared. Then, as shown in FIG. 3b, a layer to be patterned such as a permalloy layer 31 with a thickness of about 50 nm is formed by sputtering on the whole surface of the substrate 30.

Figure 3H:
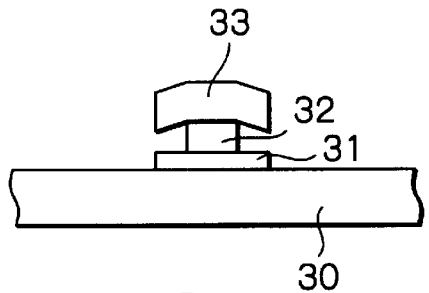
Figure 3C:

Then, as shown in FIG. 3c, resin material such as PMGI or PMGI with dye additives is coated by spin coating and then cured by pre-baking to form a lower layer 32 of the two layer resist structure on the whole surface of the layer 31.

Figure 3I:
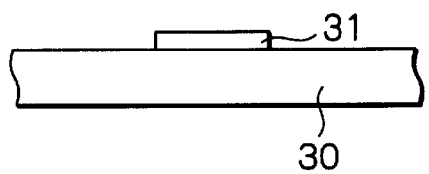
Figure 3D:
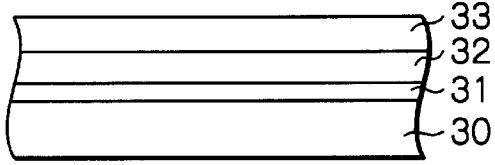

Thereafter, as shown in FIG. 3d, the aforementioned resist material is coated by spin coating and then cured by pre-baking to form an upper layer 33 of the two layer resist structure on the whole surface of the layer 32.

Figure 3E:
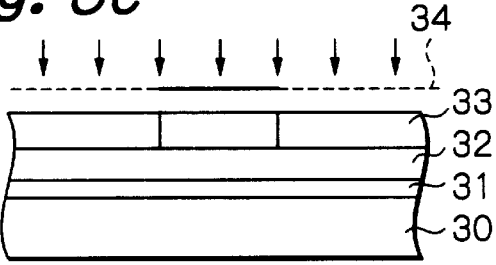
Figure 3F:
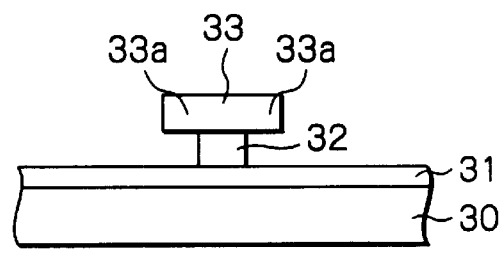

Then, as shown in FIG. 3e, these layers are exposed through a mask 34 by ultraviolet light and then developed. As a result, as shown in FIG. 3f, since the PMGI material of the lower layer 32 has higher dissolution speed than the resist material of the upper layer 33, this upper layer 33 has overhang portions 33a at both side ends and thus the two layer structure resist pattern with T-shaped cross section is formed.

Thereafter, the formed resist pattern is heat-treated. It should be noted that this heat treatment process is executed after the forming of the two layer structure resist pattern with T-shaped cross section but before a milling process using the resist pattern. By this heat treatment process, as shown in FIG. 3g, the overhang portions 33a of the upper layer 33 incline downward, namely toward the substrate 30 by a desired overhang inclination $\theta$.

FIG. 4 illustrates relationship among the process temperature and the process time of this heat treatment and the overhang inclination $\theta$.

As will be apparent from the figure, the overhang inclination $\theta$ is controllable to some extent depending upon the process temperature and the process time of the heat treatment. For practical use, the limit of the process time of the heat treatment is 1 to 60 minutes. Preferably, the process time will be a few to ten-odd minutes. If it is too short, control of the overhang inclination $\theta$ will become difficult, and if it is too long conversely, time for the whole manufacturing process will become huge. The process temperature of the heat treatment is desired within a range of 70 to 130° C. in order to obtain the desired overhang inclination $\theta$ within such proper process time. If it is lower than 70° C., the overhang portions 33a never incline, or although the overhang portions 33a incline, it takes unacceptable long time, for example, time to exceed 1 hour, in order to obtain the desired overhang inclination $\theta$. If the process temperature exceeds 250° C. that is equal to a transition point of glass, thermal decomposition of resist material will start.

The characteristics shown in FIG. 4 is measured under the conditions that the height of the lower layer 32 made of PMGI, namely the height of the undercut regions, is 0.1 $\mu$m, the width of each of the overhang portions 33a is 0.1 $\mu$m, the pre-baking temperature of the upper layer 33 made of PFi-58 of Sumitomo Chemical Co., Ltd. is 90° C., the pre-baking time of the upper layer 33 is 60 seconds, the thickness of the upper layer 33 is 0.8 $\mu$m, and the width of the upper layer 33 is 0.5 $\mu$m. The process temperature and the process time for obtaining the desired overhang inclination $\theta$ will somewhat differ depending upon compositions such as molecular weight of the resist material of the upper layer 33.

Then, as shown in FIG. 3h, ion milling is executed using the two layer structure resist pattern with the desired overhang inclination $\theta$ obtained by the heat treatment as a resist cover so that unnecessary parts of the permalloy layer 31 that is to be patterned are removed.

Thereafter, the two layer structure resist pattern is removed by dissolving in an organic solvent or reducing to ashes to obtain a milled or patterned permalloy layer 31 as shown in FIG. 3i.

FIGS. 5a to 5c schematically illustrate thin-film milling patterning processes using variously shaped resist patterns with two-layer structure.

As shown in FIG. 5a, if a thin-film is milled using a conventional two layer structure resist pattern with the T-shaped cross section, particles etched out from the milled thin-film scatter and re-deposit on the bottom surface of the upper resist layer and on the side walls of the upper and lower resist layers. Parts of the re-deposited layer will remain as burrs or micro projections even after the resist pattern is removed.

Whereas if a thin-film is milled using the two layer structure resist pattern with the overhang portions inclined downward at the desired overhang inclination $\theta$ according to this embodiment, particles etched out from the milled thin-film re-deposit only on the side walls of the upper resist layer but never re-deposit on other surface of the resist layer as shown in FIG. 5b. Thus, a precise pattern of satisfactory quality can be obtained.

However, if the overhang portions exceedingly incline over the desired overhang inclination $\theta$, the re-deposited layer on the side walls of the upper resist layer contact to the patterned thin-film as shown in FIG. 5c. Thus, in such case, no pattern of satisfactory quality can be obtained.

FIG. 6 illustrates relationship between the overhang inclination $\theta$ of the overhang portion of the two-layer structure resist pattern and the yield rate of the various patterning methods such as a milling method, a lift off method and a combined method of milling and lift off.

The yield rate of each patterning method shown in the figure was obtained by observing, using a SEM (scanning electron microscope), patterned samples with two layer structure resist patterns having different overhang inclinations $\theta$. The sample was considered as an inferior good if the edge of the patterned film had a burr, whereas considered as an excellent good if there was no burr around the edge of the patterned film. In the resist pattern of each sample, the height of the PMGI lower layer 32 (undercut region height) was 0.1 $\mu$m, the width of the overhang portions 33a (undercut region width) was 0.1 $\mu$m, and the width of the upper layer 33 was 0.5 $\mu$m. The different overhang inclinations $\theta$ were obtained by changing the process time for respective samples with the T-shaped cross section resist patterns under the constant process temperature of 70° C. During patterning of milling or lift off, the substrate was cooled so that its temperature was kept below 50° C. An 8C type milling device of Commonwealth Co., Ltd. was used for milling.

As will be noted from FIG. 6, the yield rate becomes 100% resulting a precise pattern of satisfactory quality when the overhang inclinations $\theta$ is within a range of 10 to 25 degrees.

According to this embodiment, as aforementioned, no removed material by milling is re-deposited on the bottom surface of the upper layer of the two layer structure resist pattern and on the side surfaces of the lower layer of the resist pattern. Thus, no burr will remain on the patterned layer and a precise pattern of satisfactory quality can be provided. As a result, the rejection rate is extremely reduced and the yield rate is remarkably improved. Particularly, according to this embodiment, since such resist pattern can be obtained only by performing a heat treatment process that is simple and easily controllable, the manufacturing process is never complicated.

FIGS. 7a to 7h schematically illustrate patterning processes of one layer of a thin-film magnetic head element by using a lift off method as another embodiment of a thin-film element manufacturing method according to the present invention.

Figure 7A:
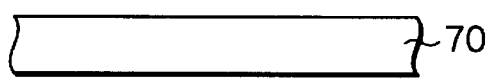
FIGS. 7a to 7h are sectional views schematically illustrating patterning processes of one layer of a thin-film magnetic head element by using a lift off method as another embodiment of a thin-film element manufacturing method according to the present invention.
Figure 7B:
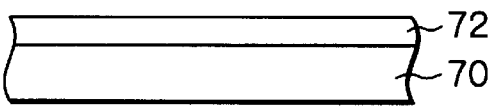

As shown in FIG. 7a, an appropriate substrate 70 made of for example AlTiC is prepared. Then, as shown in FIG. 7b, resin material such as PMGI or PMGI with dye additives is coated by spin coating and then cured by pre-baking to form a lower layer 72 of the two layer resist structure on the whole surface of the substrate 70.

Figure 7C:
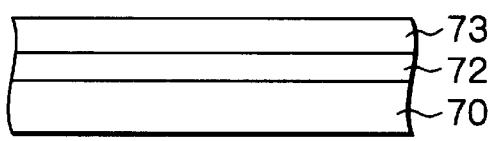

Then, as shown in FIG. 7c, a photoresist material mentioned with reference to FIG. 2 is coated by spin coating and then cured by pre-baking to form an upper layer 73 of the two layer resist structure on the whole surface of the layer 72.

Figure 7D:
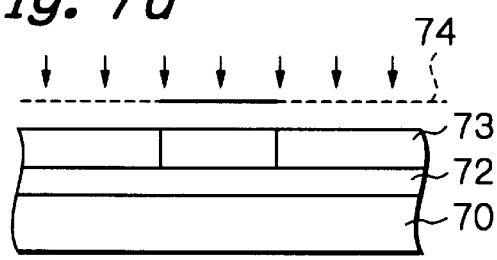
Figure 7E:
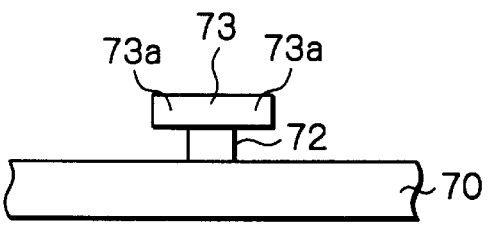

Then, as shown in FIG. 7d, these layers are exposed through a mask 74 by ultraviolet light and then developed. As a result, as shown in FIG. 7e, since the PMGI material of the lower layer 72 has higher dissolution speed than the resist material of the upper layer 73, this upper layer 73 has overhang portions 73a at both side ends and thus the two layer structure resist pattern with T-shaped cross section is formed.

Figure 7F:
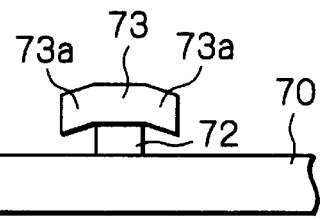

Thereafter, the formed resist pattern is heat-treated. It should be noted that this heat treatment process is executed after the forming of the two layer structure resist pattern with T-shaped cross section but before a milling process using the resist pattern. By this heat treatment process, as shown in FIG. 7f, the overhang portions 73a of the upper layer 73 incline downward, namely toward the substrate 70 by a desired overhang inclination θ.

The process temperature and the process time of this heat treatment and the overhang inclination θ obtained by this heat treatment are the same as these in the embodiment of FIGS. 3a to 3i.

Figure 7G:
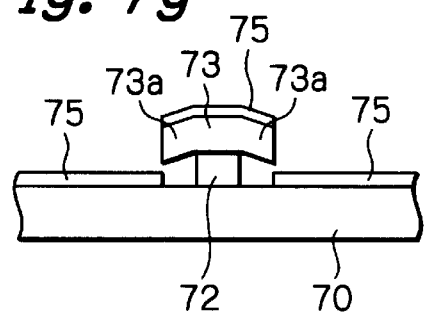

Then, as shown in FIG. 7g, deposition is executed using the two layer structure resist pattern with the desired overhang inclination θ obtained by the heat treatment as a resist cover to form a layer 75.

Figure 7H:
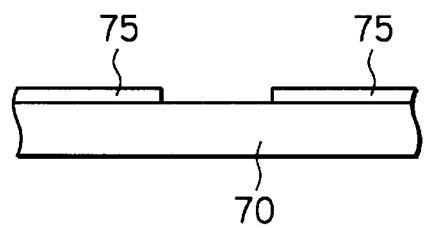

Thereafter, the two layer structure resist pattern is removed or lifted off by dissolving in an organic solvent or reducing to ashes to obtain the patterned layer 75 as shown in FIG. 7h.

FIGS. 5d to 5f schematically illustrate thin-film lift off patterning processes using variously shaped resist patterns with two-layer structure.

As shown in FIG. 5d, if a thin-film is deposited using a conventional two layer structure resist pattern with the T-shaped cross section, material of the patterning layer is deposited not only on the side surfaces and the top surface of the resist pattern but also on the substrate surface below the overhang portions (undercut regions). The deposited layer on the substrate surface below the overhang portions will remain even after the resist pattern is removed.

Whereas if a thin-film is deposited using the two layer structure resist pattern with the overhang portions inclined downward at the desired overhang inclination θ according to this embodiment, material of the patterning layer is never deposited on the substrate surface below the overhang portions (undercut regions) as shown in FIG. 5e. Thus, a precise pattern of satisfactory quality can be obtained.

However, if the overhang portions exceedingly incline over the desired overhang inclination θ, the deposited layer on the side surfaces of the upper resist layer contact to the patterned thin-film as shown in FIG. 5f. Thus, in such case, no pattern of satisfactory quality can be obtained.

As described in the embodiment of FIGS. 3a to 3i, it is apparent from FIG. 6, the yield rate becomes 100% resulting a precise pattern of satisfactory quality when the overhang inclinations θ is within a range of 10 to 25 degrees. The yield rate of each patterning method shown in FIG. 6 was obtained as described in the embodiment of FIGS. 3a to 3i. However, for the lift off method, after the two layer structure resist pattern is formed on the AlTiC substrate, a patterning layer of Ta with a thickness of 150 nm was sputtered. A SPF-740 sputtering device of Anelva Co., Ltd. was used for sputtering.

According to this embodiment, as aforementioned, material of the patterning layer is never deposited on the substrate surface below the overhang portions (undercut regions) of the two layer structure resist pattern. Thus, a precise pattern of satisfactory quality can be obtained. As a result, the rejection rate is extremely reduced and the yield rate is remarkably improved. Particularly, according to this embodiment, since such resist pattern can be obtained only by performing a heat treatment process that is simple and easily controllable, the manufacturing process is never complicated.

Another constitutions, operations and advantages of this embodiment are the same as these in the embodiment of FIGS. 3a to 3i.

FIGS. 8a to 8j schematically illustrate patterning processes of one layer of a thin-film magnetic head element by using a combined method of milling and lift off as a further embodiment of a thin-film element manufacturing method according to the present invention.

Figure 8A:
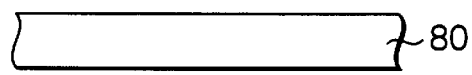
FIGS. 8a to 8j are sectional views schematically illustrating patterning processes of one layer of a thin-film magnetic head element by using a combined method of milling and lift off as a further embodiment of a thin-film element manufacturing method according to the present invention.
Figure 8B:
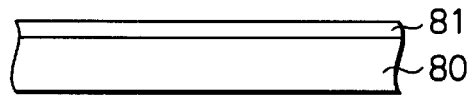

As shown in FIG. 8a, an appropriate substrate 80 made of for example AlTiC is prepared. Then, as shown in FIG. 8b, a first layer to be patterned such as a permalloy layer 81 with a thickness of about 50 nm is formed by sputtering on the whole surface of the substrate 80.

Figure 8C:
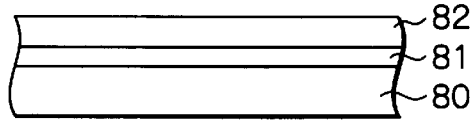

Then, as shown in FIG. 8c, resin material such as PMGI or PMGI with dye additives is coated by spin coating and then cured by pre-baking to form a lower layer 82 of the two layer resist structure on the whole surface of the layer 81.

Figure 8D:
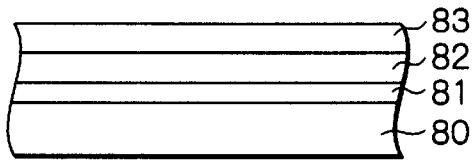

Thereafter, as shown in FIG. 8d, a photoresist material mentioned with reference to FIG. 2 is coated by spin coating and then cured by pre-baking to form an upper layer 83 of the two layer resist structure on the whole surface of the layer 82.

Figure 8E:
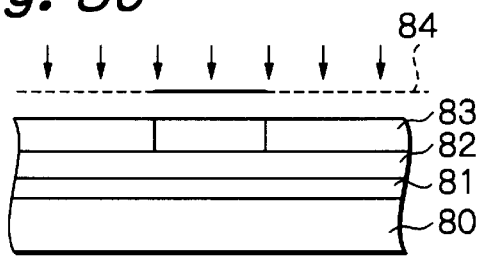
Figure 8F:
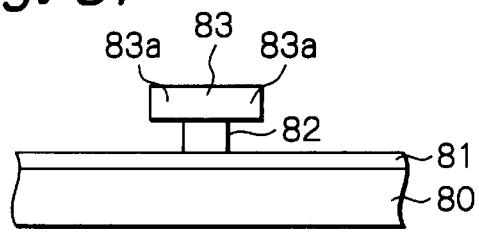

Then, as shown in FIG. 8e, these layers are exposed through a mask 84 by ultraviolet light and then developed. As a result, as shown in FIG. 8f, since the PMGI material of the lower layer 82 has higher dissolution speed than the resist material of the upper layer 83, this upper layer 83 has overhang portions 83a at both side ends and thus the two layer structure resist pattern with T-shaped cross section is formed.

Figure 8G:
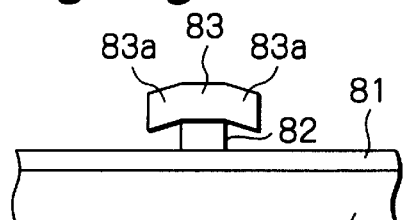

Thereafter, the formed resist pattern is heat-treated. It should be noted that this heat treatment process is executed after the forming of the two layer structure resist pattern with T-shaped cross section but before a milling process using the resist pattern. By this heat treatment process, as shown in FIG. 8g, the overhang portions 83a of the upper layer 83 incline downward, namely toward the substrate 80 by a desired overhang inclination θ.

The process temperature and the process time of this heat treatment and the overhang inclination θ obtained by this heat treatment are the same as these in the embodiment of FIGS. 3a to 3i.

Figure 8H:
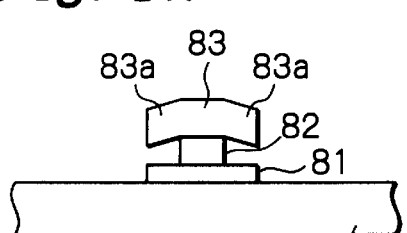
Figure 8I:
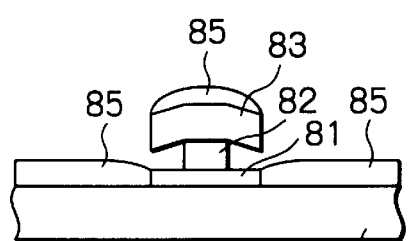

Then, as shown in FIG. 8h, ion milling is executed using the two layer structure resist pattern with the desired overhang inclination θ obtained by the heat treatment as a resist cover so that unnecessary parts of the first layer 81 that is to be patterned are removed. Sequentially, as shown in FIG. 8i, deposition is executed using the same two layer structure resist pattern as a resist cover to form a second layer 85 to be patterned, made of for example metallic material or ceramic material.

Figure 8J:
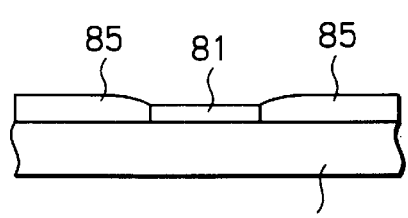

Thereafter, the two layer structure resist pattern is removed by dissolving in an organic solvent or reducing to ashes to obtain milled or patterned first and second layers 81 and 85 as shown in FIG. 8*j*.

As described in the embodiments of FIGS. 3*a* to 3*i* and of FIGS. 7*a* to 7*h*, it is apparent from FIG. 6, the yield rate becomes 100% resulting a precise pattern of satisfactory quality when the overhang inclinations θ is within a range of 10 to 25 degrees. The yield rate shown in FIG. 6 was obtained as described in the embodiments of FIGS. 3*a* to 3*i* and of FIGS. 7*a* to 7*h*.

According to this embodiment, as aforementioned, since no removed material by milling is re-deposited on the bottom surface of the upper layer of the two layer structure resist pattern and on the side surfaces of the lower layer of the resist pattern, no burr will remain on the patterned layer. Furthermore, material of the patterning layer is never deposited on the substrate surface below the overhang portions (undercut regions) of the two-layer structure resist pattern. Thus, a precise pattern of satisfactory quality can be obtained. As a result, the rejection rate is extremely reduced and the yield rate is remarkably improved. Particularly, according to this embodiment, since such resist pattern can be obtained only by performing a heat treatment process that is simple and easily controllable, the manufacturing process is never complicated.

Another constitutions, operations and advantages of this embodiment are the same as these in the embodiment of FIGS. 3*a* to 3*i*.

FIGS. 9*a* to 9*i* schematically illustrate patterning processes of one layer of a thin-film magnetic head element by using a dry-etching or milling method as a still further embodiment of a thin-film element manufacturing method according to the present invention.

Figure 9A:
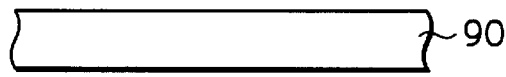
FIGS. 9a to 9i are sectional views schematically illustrating patterning processes of one layer of a thin-film magnetic head element by using a milling method as a still further embodiment of a thin-film element manufacturing method according to the present invention.
Figure 9B:
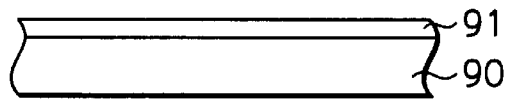

As shown in FIG. 9*a*, an appropriate substrate 90 made of for example AlTiC is prepared. Then, as shown in FIG. 9*b*, a layer to be patterned such as a permalloy layer 91 with a thickness of about 50 nm is formed by sputtering on the whole surface of the substrate 90.

Figure 9C:
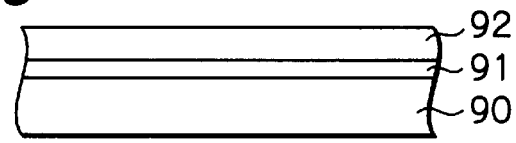

Then, as shown in FIG. 9*c*, resin material such as PMGI or PMGI with dye additives is coated by spin coating and then cured by pre-baking to form a lower layer 92 of the two layer resist structure on the whole surface of the layer 91.

Figure 9D:
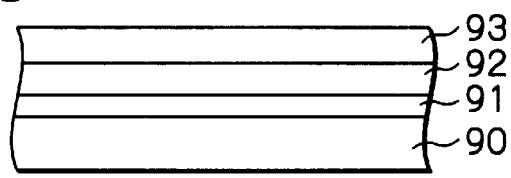

Thereafter, as shown in FIG. 9*d*, the aforementioned resist material is coated by spin coating and then cured by pre-baking to form an upper layer 93 of the two layer resist structure on the whole surface of the layer 92.

Figure 9E:
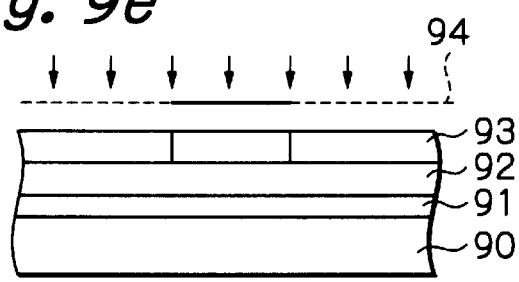
Figure 9F:
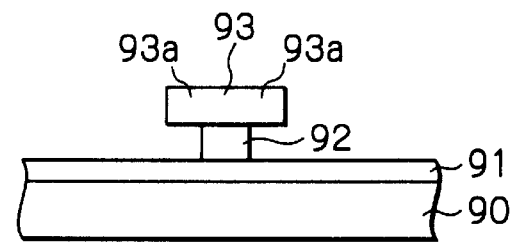

Then, as shown in FIG. 9*e*, these layers are exposed through a mask 94 by ultraviolet light and then developed. As a result, as shown in FIG. 9*f*, since the PMGI material of the lower layer 92 has higher dissolution speed than the resist material of the upper layer 93, this upper layer 93 has overhang portions 93*a* at both side ends and thus the two layer structure resist pattern with T-shaped cross section is formed.

Then, ion milling is performed using the formed twolayer structure resist pattern as a resist cover, without executing an additional heat treatment process.

In the conventional milling process, since there is remarkable generation of heat with the ion milling, the substrate is cooled so as to prevent the temperature from rising. However, in this embodiment, the cooling temperature during the ion milling is controlled to apply proper heat to the formed resist pattern. In other words, according to this embodiment, a heat treatment is executed during the milling process using the resist pattern after the forming of the two layer structure resist pattern with T-shaped cross section.

Figure 9G:
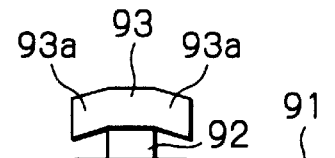

Thus, as shown in FIG. 9*g*, the permalloy layer 91 which is a layer to be patterned is milled and unnecessary parts thereof are gradually removed, while the overhang portions 93*a* of the upper layer 93 incline downward, namely toward the substrate 90 by a desired overhang inclination θ by the applied heat.

The process temperature and the process time of this heat treatment and the overhang inclination θ obtained by this heat treatment are the same as these in the embodiment of FIGS. 3*a* to 3*i*.

Figure 9H:
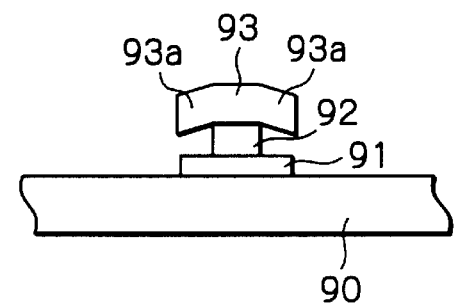

As the result of the ion milling, as shown in FIG. 9*h*, all the unnecessary parts of the permalloy layer 91 that is to be patterned are removed.

Figure 9I:
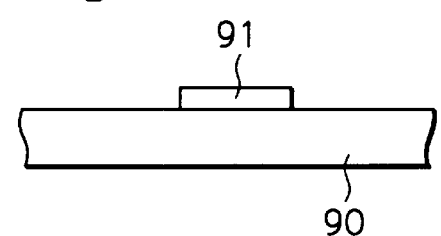

Thereafter, the two layer structure resist pattern is removed by dissolving in an organic solvent or reducing to ashes to obtain the milled or patterned permalloy layer 91 as shown in FIG. 9*i*.

As described in the embodiments of FIGS. 3*a* to 3*i*, it is apparent from FIG. 6, the yield rate becomes 100% resulting a precise pattern of satisfactory quality when the overhang inclinations θ is within a range of 10 to 25 degrees. In practice, an yield rate of 95% was obtained when the ion milling was executed with the heat treatment of the resist pattern at the process temperature of 100° C. for 15 minutes.

According to this embodiment, as aforementioned, since no removed material by milling is re-deposited on the bottom surface of the upper layer of the two layer structure resist pattern and on the side surfaces of the lower layer of the resist pattern, no burr will remain on the patterned layer. Thus, a precise pattern of satisfactory quality can be obtained. As a result, the rejection rate is extremely reduced and the yield rate is remarkably improved. Particularly, according to this embodiment, since such resist pattern can be obtained only by performing a heat treatment process that is simple and easily controllable, the manufacturing process is never complicated. Furthermore, according to this embodiment, since no additional process for heat treatment is needed, the resist pattern forming process or the manufacturing process of a thin-film element can be more simplified.

Another constitutions, operations and advantages of this embodiment are the same as these in the embodiment of FIGS. 3*a* to 3*i*.

FIGS. 10*a* to 10*h* schematically illustrate patterning processes of one layer of a thin-film magnetic head element by using a lift off method as a further embodiment of a thin-film element manufacturing method according to the present invention.

As shown in FIG. 10*a*, an appropriate substrate 100 made of for example AlTiC is prepared. Then, as shown in FIG. 10*b*, resin material such as PMGI or PMGI with dye additives is coated by spin coating and then cured by pre-baking to form a lower layer 102 of the two layer resist structure on the whole surface of the substrate 100.

Then, as shown in FIG. 10*c*, a photoresist material mentioned with reference to FIG. 2 is coated by spin coating and then cured by pre-baking to form an upper layer 103 of the two layer resist structure on the whole surface of the layer 102.

Then, as shown in FIG. 10*d*, these layers are exposed through a mask 104 by ultraviolet light and then developed. As a result, as shown in FIG. 10*e*, since the PMGI material of the lower layer 102 has higher dissolution speed than the resist material of the upper layer 103, this upper layer 103 has overhang portions 103a at both side ends and thus the two layer structure resist pattern with T-shaped cross section is formed.

Then, deposition of a layer 105 to be patterned is performed using the formed two layer structure resist pattern as a resist cover, without executing an additional heat treatment process.

In the conventional deposition process, since there is remarkable generation of heat with the deposition, the substrate is cooled so as to prevent the temperature from rising. However, in this embodiment, the cooling temperature during the deposition is controlled to apply proper heat to the formed resist pattern. In other words, according to this embodiment, a heat treatment is executed during the lift off patterning process using the resist pattern after the forming of the two layer structure resist pattern with T-shaped cross section.

Thus, as shown in FIG. 10f, the layer 105 to be patterned is gradually deposited, while the overhang portions 103a of the upper layer 103 incline downward, namely toward the substrate 100 by a desired overhang inclination θ by the applied heat.

The process temperature and the process time of this heat treatment and the overhang inclination θ obtained by this heat treatment are the same as these in the embodiment of FIGS. 3a to 3i.

As shown in FIG. 10g, deposition is continued using the two-layer structure resist pattern with the desired overhang inclination θ obtained by the heating as a resist cover to form the patterned layer 105.

Thereafter, the two layer structure resist pattern is removed or lifted off by dissolving in an organic solvent or reducing to ashes to obtain the patterned layer 105 as shown in FIG. 10h.

As described in the embodiments of FIGS. 3a to 3i, it is apparent from FIG. 6, the yield rate becomes 100% resulting a precise pattern of satisfactory quality when the overhang inclinations θ is within a range of 10 to 25 degrees. The yield rate shown in FIG. 6 was obtained as described in the embodiments of FIGS. 7a to 7h.

According to this embodiment, as aforementioned, material of the patterning layer is never deposited on the substrate surface below the overhang portions (undercut regions) of the two layer structure resist pattern. Thus, a precise pattern of satisfactory quality can be obtained. As a result, the rejection rate is extremely reduced and the yield rate is remarkably improved. Particularly, according to this embodiment, since such resist pattern can be obtained only by performing a heat treatment process that is simple and easily controllable, the manufacturing process is never complicated. Furthermore, according to this embodiment, since no additional process for heat treatment is needed, the resist pattern forming process or the manufacturing process of a thin-film element can be more simplified.

Another constitutions, operations and advantages of this embodiment are the same as these in the embodiment of FIGS. 3a to 3i.

FIGS. 11a to 11j schematically illustrate patterning processes of one layer of a thin-film magnetic head element by using a combined method of milling and lift off as a still further embodiment of a thin-film element manufacturing method according to the present invention.

Figure 11A:
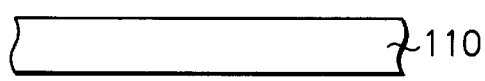
FIGS. 11a to 11j are sectional views schematically illustrating patterning processes of one layer of a thin-film magnetic head element by using a combined method of milling and lift off as a still further embodiment of a thin-film element manufacturing method according to the present invention.
Figure 11B:
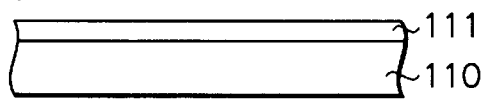

As shown in FIG. 11a, an appropriate substrate 110 made of for example AlTiC is prepared. Then, as shown in FIG. 11b, a first layer to be patterned such as a permalloy layer 111 with a thickness of about 50 nm is formed by sputtering on the whole surface of the substrate 110.

Figure 11C:
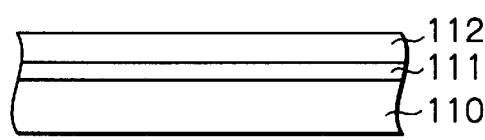

Then, as shown in FIG. 11c, resin material such as PMGI or PMGI with dye additives is coated by spin coating and then cured by pre-baking to form a lower layer 112 of the two layer resist structure on the whole surface of the layer 111.

Figure 11D:
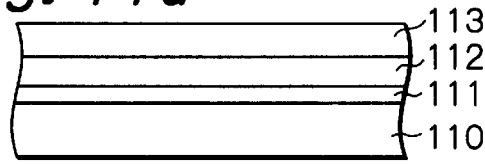

Thereafter, as shown in FIG. 11d, a photoresist material mentioned with reference to FIG. 2 is coated by spin coating and then cured by pre-baking to form an upper layer 113 of the two layer resist structure on the whole surface of the layer 112.

Figure 11E:
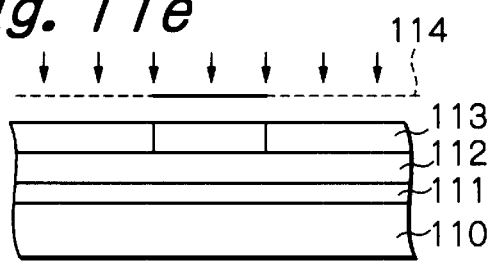
Figure 11F:
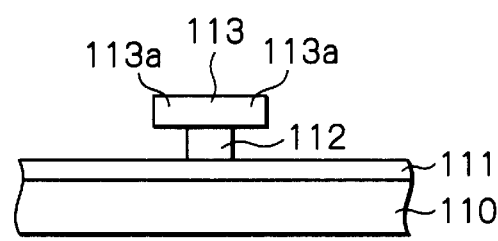

Then, as shown in FIG. 11e, these layers are exposed through a mask 114 by ultraviolet light and then developed. As a result, as shown in FIG. 11f, since the PMGI material of the lower layer 112 has higher dissolution speed than the resist material of the upper layer 113, this upper layer 113 has overhang portions 113a at both side ends and thus the two layer structure resist pattern with T-shaped cross section is formed.

Then, ion milling is performed using the formed two-layer structure resist pattern as a resist cover, without executing an additional heat treatment process.

In the conventional milling process, since there is remarkable generation of heat with the ion milling, the substrate is cooled so as to prevent the temperature from rising. However, in this embodiment, the cooling temperature during the ion milling is controlled to apply proper heat to the formed resist pattern. In other words, according to this embodiment, a heat treatment is executed during the milling process using the resist pattern after the forming of the two layer structure resist pattern with T-shaped cross section.

Figure 11G:
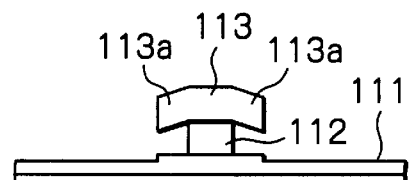

Thus, as shown in FIG. 11g, the permalloy layer 111 which is a layer to be patterned is milled and unnecessary parts thereof are gradually removed, while the overhang portions 113a of the upper layer 113 incline downward, namely toward the substrate 110 by a desired overhang inclination θ by the applied heat.

The process temperature and the process time of this heat treatment and the overhang inclination θ obtained by this heat treatment are the same as these in the embodiment of FIGS. 3a to 3i.

Figure 11H:
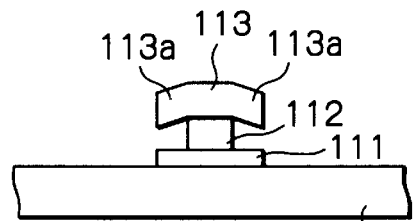
Figure 11I:
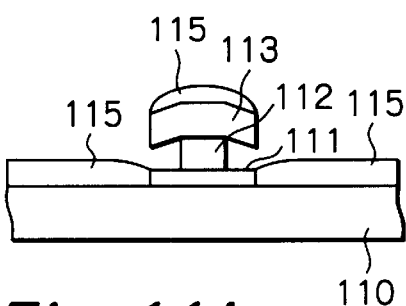

By the ion milling, the first layer 111 is patterned as shown in FIG. 11h. Sequentially, as shown in FIG. 11i, deposition is executed using the same two layer structure resist pattern as a resist cover to form a second layer 115 to be patterned, made of for example metallic material or ceramic a material.

Figure 11J:
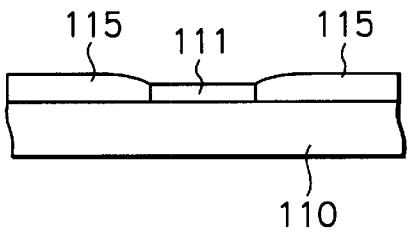

Thereafter, the two layer structure resist pattern is removed by dissolving in an organic solvent or reducing to ashes to obtain milled or patterned first and second layers 111 and 115 as shown in FIG. 11j.

As described in the embodiment of FIGS. 3a to 3i, it is apparent from FIG. 6, the yield rate becomes 100% resulting a precise pattern of satisfactory quality when the overhang inclinations θ is within a range of 10 to 25 degrees. The yield rate shown in FIG. 6 was obtained as described in the embodiments of FIGS. 9a to 9i and of FIGS. 10a to 10h.

According to this embodiment, as aforementioned, since no removed material by milling is re-deposited on the bottom surface of the upper layer of the two layer structure resist pattern and on the side surfaces of the lower layer of the resist pattern, no burr will remain on the patterned layer. Furthermore, material of the patterning layer is never deposited on the substrate surface below the overhang portions (undercut regions) of the two-layer structure resist pattern. Thus, a precise pattern of satisfactory quality can be obtained. As a result, the rejection rate is extremely reduced and the yield rate is remarkably improved. Particularly, according to this embodiment, since such resist pattern can be obtained only by performing a heat treatment process that is simple and easily controllable, the manufacturing process is never complicated. Furthermore, according to this embodiment, since no additional process for heat treatment is needed, the resist pattern forming process or the manufacturing process of a thin-film element can be more simplified.

Another constitutions, operations and advantages of this embodiment are the same as these in the embodiment of FIGS. 3a to 3i.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for forming a resist pattern, comprising the steps of:
    forming a two layer structure resist pattern with a T-shaped cross section, said two layer structure resist pattern consisting of a lower layer made of a resin material and an upper layer made of a resist material with overhang portions; and
    heat-treating the formed two layer structure resist pattern at a temperature within a range of 70 to 130° C. so that said overhang portions of said upper layer incline downward,
    wherein the heat-treating step includes heating the formed two layer structure resist pattern so that said overhang portions of said upper layer incline downward by 10 to 25 degrees.

2. The method as claimed in claim 1, wherein said resin material is polymethyl glutarimide.

3. The method as claimed in claim 1, wherein said resin material is polymethyl glutarimide with dye additives.

4. A method for manufacturing a thin-film element, comprising the steps of:
    forming a two layer structure resist pattern with a T-shaped cross section, said two layer structure resist pattern consisting of a lower layer made of a resin material and an upper layer made of a resist material with overhang portions;
    heat-treating the formed two layer structure resist pattern at a temperature within a range of 70 to 130° C. so that said overhang portions of said upper layer incline downward; and
    patterning a thin-film using the heat-treated two-layer structure resist pattern,
    wherein the heat-treating step includes heating the formed two layer structure resist pattern so that said overhang portions of said upper layer incline downward by 10 to 25 degrees.

5. The method as claimed in claim 4, wherein the heat-treating step is executed before the patterning step.

6. The method as claimed in claim 4, wherein the heat-treating step is executed during the patterning step.

7. The method as claimed in claim 6, wherein the heat-treating step includes controlling cooling temperature during the patterning step.

8. The method as claimed in claim 4, wherein said resin material is polymethyl glutarimide.

9. The method as claimed in claim 4, wherein said resin material is polymethyl glutarimide with dye additives.

10. A method for manufacturing a thin-film element, comprising the steps of:
    depositing a layer to be patterned on a substrate;
    forming a two layer structure resist pattern with a T-shaped cross section on said layer to be patterned, said two layer structure resist structure resist pattern consisting of a lower layer made of a resin material and an upper layer made of a resist material with overhang portions;
    heat-treating the formed two layer structure resist pattern at a temperature within a range of 70 to 130° C. so that said overhang portions of said upper layer incline downward; and
    dry-etching said layer to be patterned, using the heat-treated two layer structure resist pattern,
    wherein the heat-treating step includes heating the formed two layer structure resist pattern so that said overhang portions of said upper layer incline downward by 10 to 25 degrees.

11. The method as claimed in claim 10, wherein the heat-treating step is executed before the dry-etching step.

12. The method as claimed in claim 10, wherein the heat-treating step is executed during the dry-etching step.

13. The method as claimed in claim 12, wherein the heat-treating step includes controlling cooling temperature during the dry-etching step.

14. The method as claimed in claim 10, wherein said resin material is polymethyl glutarimide.

15. The method as claimed in claim 10, wherein said resin material is polymethyl glutarimide with dye additives.

16. A method for manufacturing a thin-film element, comprising the steps of:
    forming a two layer structure resist pattern with a T-shaped cross section on a substrate, said two layer structure resist pattern consisting of a lower layer made of a resin material and an upper layer made of a resist material with overhang portions;
    heat-treating the formed two layer structure resist pattern at a temperature within a range of 70 to 130° C. so that said overhang portions of said upper layer incline downward; and
    depositing a layer to be patterned, using the heat-treated two layer structure resist pattern
    wherein the heat-treating step includes heating the formed two layer structure resist pattern so that said overhang portions of said upper layer incline downward by 10 to 25 degrees.

17. The method as claimed in claim 16, wherein the heat-treating step is executed before the depositing step.

18. The method as claimed in claim 16, wherein the heat-treating step is executed during the depositing step.

19. The method as claimed in claim 18, wherein the heat-treating step includes controlling cooling temperature during the depositing step.

20. The method as claimed in claim 16, wherein said resin material is polymethyl glutarimide.

21. The method as claimed in claim 16, wherein said resin material is polymethyl glutarimide with dye additives.

22. A method for manufacturing a thin-film element, comprising the steps of:
    depositing a first layer to be patterned on a substrate;
    forming a two layer structure resist pattern with a T-shaped cross section on said first layer to be patterned, the two layer structure resist pattern consisting of a lower layer made of a resin material and an upper layer made of a resist material with overhang portions;

heat-treating the formed two layer structure resist pattern at a temperature within a range of 70 to 130° C. so that said overhang portions of said upper layer incline downward;

dry-etching said first layer to be patterned, using the heat-treating two layer structure resist pattern; and depositing a second layer to be patterned, using the heat-treated two layer structure resist pattern, wherein the heat-treating step includes heating the formed two layer structure resist pattern so that said overhang portions of said upper layer incline downward by 10 to 25 degrees.

23. The method as claimed in claim 22, wherein the heat-treating step is executed before the dry-etching step.

24. The method as claimed in claim 22, wherein the heat-treating step is executed during the dry-etching step.

25. The method as claimed in claim 24, wherein the heat-treating step includes controlling cooling temperature during the dry-etching step.

26. The method as claimed in claim 22, wherein said resin material is polymethyl glutarimide.

27. The method as claimed in claim 22, wherein said resin material is polymethyl glutarimide with dye additives.

* * * * *